United States Patent
Yasuda

[11] Patent Number: 5,889,349
[45] Date of Patent: Mar. 30, 1999

[54] CYLINDRICAL CORELESS VIBRATING MOTOR

[75] Inventor: Hisafumi Yasuda, Tokyo, Japan

[73] Assignee: Namiki Precision Jewel Co., Ltd., Tokyo, Japan

[21] Appl. No.: 546,762

[22] Filed: Oct. 23, 1995

[51] Int. Cl.$^6$ .......................... H02K 21/26; H02K 5/04; H02K 7/08
[52] U.S. Cl. .................... 310/261; 310/40 MM; 310/81; 310/90; 310/89; 310/266
[58] Field of Search .................. 310/266, 81, 90, 310/40 MM, 89, 239, 242; 340/407.1

[56] References Cited

U.S. PATENT DOCUMENTS

| | | | |
|---|---|---|---|
| 3,475,632 | 10/1969 | Moresi | 310/90 |
| 3,514,654 | 5/1970 | Moresi | 310/67 |
| 3,604,962 | 9/1971 | Larson | 310/67 |
| 4,327,304 | 4/1982 | Aoki | 310/266 |
| 4,337,568 | 7/1982 | Morisawa | 29/598 |
| 4,794,392 | 12/1988 | Selinko | 340/825.46 |
| 4,973,871 | 11/1990 | Bisantz | 310/154 |
| 5,059,846 | 10/1991 | Concannon | 310/239 |
| 5,077,503 | 12/1991 | Tamura et al. | 310/88 |
| 5,107,155 | 4/1992 | Yamaguchi | 310/81 |
| 5,270,602 | 12/1993 | Takehara | 310/198 |
| 5,347,187 | 9/1994 | Tsuzaki et al. | 310/40 MM |
| 5,473,210 | 12/1995 | Someya et al. | 310/154 |
| 5,621,260 | 4/1997 | Fukuoka et al. | 310/154 |

*Primary Examiner*—Nestor Ramirez
*Assistant Examiner*—Michael J. Wallace, Jr.
*Attorney, Agent, or Firm*—Sixbey, Friedman, Leedom & Ferguson, PC; Gerald J. Ferguson, Jr.; Eric J. Robinson

[57] ABSTRACT

A coreless motor device having a rotor comprised of a cylindrical coil, a coil support, a rotary shaft inserted and stabilized in the center of the coil support, and a commutator installed either on the coil support or rotary shaft is disclosed. A cylindrical field magnet is positioned on the inside of the cylindrical coil, and one end of the cylindrical field magnet is affixed at a bottom of a cylindrical housing that surrounds the outer circumference of the cylindrical coil. The rotary shaft of the motor is supported by a thrust bearing at the end of the cylindrical field magnet opposite the end that is affixed at the bottom of the cylindrical housing, and it is also supported by a multiple number of radial bearings installed at intervals on the upper part of the cylindrical housing.

16 Claims, 16 Drawing Sheets

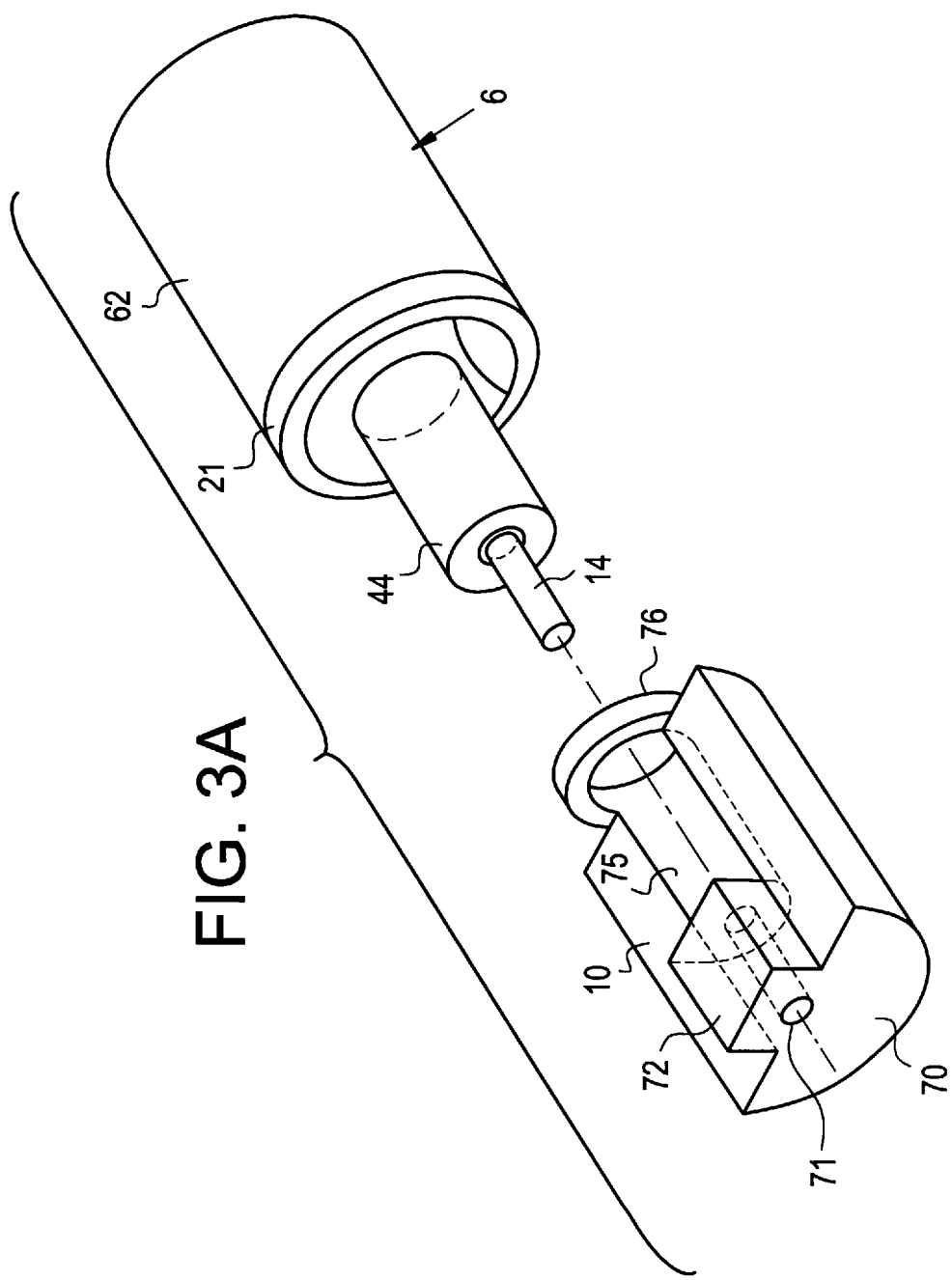

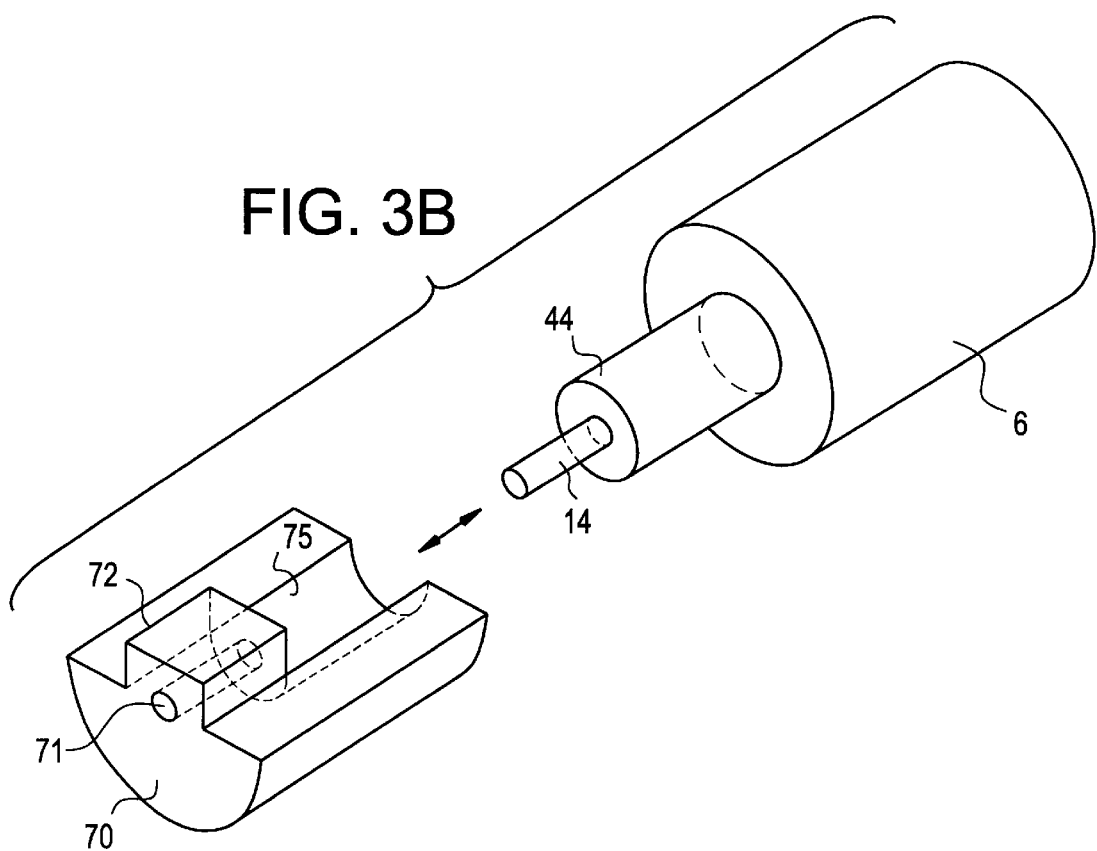

CYLINDRICAL CORELESS VIBRATING MOTOR

FIELD OF THE INVENTION

This invention relates generally to coreless motor devices, and more specifically to cylindrical coreless motor devices having a novel rotor bearing structure that is useful, for example, as a signalling device in a vibration type beeper, is small and easy to manufacture, has excellent durability and shock resistance, and has excellent mass productivity at a low cost. This invention further relates to a weight for such coreless motor devices used in such signalling devices for generating vibrations and to a support structure for such a motor device.

BACKGROUND OF THE INVENTION

In recent years, pocket paging devices, or beepers, that produce a vibration instead of an audible signal to alert a user have increased in popularity. As a result of this increase in popularity, improvements in the motor devices used to generate such a vibration alert signal have been demanded and made.

An example of one such motor device, which employs a hollow cylindrical coreless motor, is illustrated in FIG. 15. This device has a rotor consisting of a cylindrical coil 1, a support 2 for the cylindrical coil 1, a commutator 3 formed on the support 2, and a rotary shaft 14 rotatably supported through the center of the support 2. The rotary shaft 14 of the rotor is inserted through a hollow cylindrical field magnet 5 and is supported by a bearing 7 positioned at one end of a cylindrical housing 6 and a bearing 8 positioned at the other end of the housing 6. Usually, in the case of a coreless motor device of this configuration, an eccentric weight 10 with an offset center of gravity is installed at the tip of the rotary shaft 14 and a brush 9 is provided to contact the commutator 3.

Where the motor device is to be used in a portable environment, it is desirable to make the motor as small as possible. As can be seen in FIG. 15, construction of such a cylindrical coreless motor device, however, requires hollow drilling of the field magnet 5 in order that the rotary shaft 14 can be inserted through the field magnet 5. The required hollow drilling into a small diameter magnet, such as field magnet 5, however, is very difficult and consequently miniaturization of the motor device is limited.

In order to solve the shortcomings of such conventional motor devices and to develop a smaller motor device without the difficulty of performing hollow drilling of a small diameter magnet, a motor device as shown in FIG. 16, for example, was developed. The motor device illustrated in FIG. 16 has a rotor including a cylindrical coil 1 for a cylindrical coreless motor, a support 2 for the cylindrical coil 1, a commutator 3 formed on the support 2, and a rotary shaft 14 rotatably supported through the center of the support 2. The rotary shaft 14 is supported by a bearing 11 formed at one end of the cylindrical field magnet 15, which is affixed at an opposite end to one end of a cylindrical housing 6, and a bearing 13 mounted in a brush housing 12 positioned at the other end of the cylindrical housing 6. The rotary shaft 14 extends out from the housing 6 on the opposite side of the magnet 15 and functions as an output shaft.

A brush 9 is installed in a brush housing 12, and a lead wire 16 is connected. A cone-shaped central hole 17 is made at the center of the magnet 15 on the side nearest bearing 11 and the rotary shaft 14 is supported by a ball 18 that bears the thrust load of the rotary shaft 14. Alternatively, instead of using the above ball 18, a configuration such as shown in FIG. 17 could be used where a hard plate 19 is placed on the surface of magnet 15 and the rounded end of a rotary shaft 14 is supported in direct contact with the hard plate 19.

Since these coreless motor devices are constructed such that the rotary shaft 14 does not pass through the magnet 15 and the output shaft is placed at the opposite side of the magnet 15, the diameter of the magnet 15 can be smaller. Consequently, miniaturization of the motor is more easily accomplished. When the support for brush 9 and the bearing housing are to be made integral, the parts can be made compact and miniaturization and manufacturing of the motor is simplified. In addition, by installing the bearing 11 at the tip of the magnet 15 to bear the thrust load, torque loss caused by friction is reduced. It is a noteworthy fact that this novel configuration made miniaturization of cylindrical coreless motor devices possible.

Furthermore, it should be noted that the coreless motor device of this configuration includes an eccentric weight 10 with an offset center of gravity that is installed at the tip of the rotary shaft 14. Typically, as shown in more detail in FIG. 18, this weight 10 is fabricated from a metal of high density such as tungsten to form a semicircular part 70, a hole 71, and a raised portion 72. Weight 10 is typically installed on the rotary shaft 14 of a small cylindrical coreless motor 73, which operates to rotate weight 10. However, in the case of such weights having the form as shown in FIG. 18, a problem results in that the weight does not generate sufficient rotational force, and thus vibration, when it is miniaturized and made lighter. In addition, as a consequence of miniaturization, a very thin shaft is used as rotary shaft 14, and thus rotary shaft 14 of motor 73 is easily bent during operation.

SUMMARY OF THE INVENTION

Despite the above improvements, there still remain problems to be corrected in the device designed to support the thrust load of the rotary shaft 14. Specifically, the diameter of the rotary shaft 14 becomes smaller as miniaturization advances and therefore the rotary shaft 14 deforms more readily due to stress in the radial direction as the eccentric weight 10 rotates. In addition, it is unavoidable that shock resistance also decreases in such devices. Consequently, realization of a cylindrical coreless motor device having a novel configuration is needed to enable miniaturization of a motor device without requiring hollow drilling of a magnet, while also improving durability and shock resistance by suppressing deformation of the rotary shaft.

In view of the circumstances stated above it is an object of the present invention to improve on the shortcomings of the conventional devices and present a novel coreless motor device with excellent durability and shock resistance as well as ease of manufacture and miniaturization.

In order to accomplish the above objectives, a coreless motor device in accordance with a first embodiment of the present invention includes a rotor comprised of a cylindrical coil, its support, a rotary shaft inserted and stabilized in the center of the cylindrical coil support, a commutator installed either on the cylindrical coil support or the rotary shaft, and a brush, in contact with the commutator. A cylindrical field magnet is positioned in the inside of the cylindrical coil, and one end of the cylindrical field magnet is affixed at the bottom of a cylindrical housing which surrounds the outer circumference of the cylindrical coil with a clearance therebetween. The coreless motor device is characterized by the fact that the rotary shaft of the rotor is supported by a thrust bearing at the end of the cylindrical field magnet opposite to the end affixed to the bottom of the cylindrical housing, and it is also supported by a multiple number of radial bearing parts installed at intervals in the upper part of the cylindrical housing, which upper part could have a reduced diameter relative to said bottom part.

In the case of a coreless motor device in accordance with the present invention, the thrust bearing of the field magnet and a multiple number of radial bearings attached to the cylindrical housing support the rotary shaft as explained above. As a result, rotary shaft deformation due to rotation is suppressed even when the diameter of the shaft becomes smaller, and shock resistance is also further improved. Furthermore, since hollow drilling is not needed for the magnet, miniaturization of the motor device is easily accomplished and the manufacturing process is simplified.

However, even in view of the improvements discussed above, there still remain problems to be corrected in such motor devices having a multiple number of radial bearings. Specifically, the brush housing in the above embodiment is designed to be attached by inserting it into a notched part of the device housing, resulting in a complicated structure and therefore a higher manufacturing cost.

Consequently, in accordance with a second embodiment of the present invention, a cylindrical coreless motor device with a novel configuration has been developed to enable miniaturization of a motor without requiring hollow drilling of a magnet and to improve durability and shock resistance by suppressing deformation of the rotary shaft as well as being capable of mass production at low cost. Accordingly, it is an object of the present invention to provide a smaller, highly efficient, cylindrical coreless vibrating motor which can be manufactured easily at low cost.

In accordance with the second embodiment of the present invention, a motor device as illustrated in FIGS. 7–9 of the present application was developed. The cylindrical coreless vibrating motor in accordance with this second embodiment includes a rotor comprised of a cylindrical coil 1, a commutator 32 serving also as a coil support, a brush 9 in contact with the commutator, a rotary shaft 14 inserted and stabilized in the center of the above commutator 32 serving also as a cylindrical coil support, and a commutator 32 installed either on the cylindrical coil 1 or rotary shaft 14. On the inside of the cylindrical coil 1, one end of a cylindrical field magnet 35 is affixed to the bottom 50 of a cylindrical housing 36 which surrounds the outer circumference of the cylindrical coil with a clearance therebetween and has a small diameter bearing housing 33 (having a diameter smaller than the cylindrical housing 36) stabilized at the upper part of the cylindrical housing 36. The cylindrical coreless vibrating motor in accordance with this embodiment is characterized by the fact that the rotary shaft 14 of the rotor is supported by a thrust bearing 110 at the end of the cylindrical field magnet 35 opposite to the end that is affixed at the bottom 50 of the cylindrical housing 36, and is also supported by a multiple number of radial bearing parts A and B installed at intervals within the small diameter bearing housing 33, which could be, for example, a resin-molded bearing housing. At least one of the radial bearing parts are formed integrally within the resin-molded bearing housing 33. In addition, a cylindrical bearing 43 having two radial bearing parts A and B could be fitted into the small diameter bearing housing 44 as shown in FIGS. 8 and 9.

In the case of the cylindrical coreless vibrating motor in accordance with this embodiment of the present invention, a resin-molded, small diameter bearing housing was used as explained above. Consequently, the simple shape of the iron cylindrical housing results in a lower price and the integral formation of the radial bearing parts within the resin-molded small diameter bearing housing eliminates the need for expensive bearings thus lowering the cost. Furthermore, forming the cylindrical bearings with radial bearing parts to fit into the small diameter bearing housing results in easy manufacturing and assembly.

Furthermore, in accordance with the present invention, a weight for generating vibrations physically detectable by a human as a result of a rotary motion of the weight affixed to a rotary shaft of a vibrating motor as the vibrating motor rotates is disclosed. The weight is comprised of a semi-circle part having a groove and a raised portion having a hole for receiving a shaft of a motor, such that a small diameter bearing housing can be inserted into the groove in the semi-circular part. In addition, the weight could include a ring having a prescribed clearance with the outer circumference of the small diameter bearing housing for reducing stress to a rotary shaft of the vibrating motor.

Finally, in accordance with another embodiment, the present invention eliminates such shortcomings as stated above and further presents a small motor terminal for which the number of work operations is reduced by simultaneously installing and securing the motor, and an accurate contact point is ensured without causing defects due to vibrations even when a vibration source exists.

BRIEF DESCRIPTION OF THE DRAWINGS

FIG. 3a is an external exploded diagonal view of the present invention as shown in FIG. 1 illustrating a first preferred embodiment of a weight for use with a vibrating motor accordingly to the present invention.

FIG. 3b is a diagonal view showing a second preferred embodiment of a weight for use with a vibrating motor accordingly to the present invention.

FIG. 3c is a cross-sectional view of the weight for use with a vibrating motor accordingly to the present invention as shown in FIG. 3a.

DETAILED DESCRIPTION OF THE PREFERRED EMBODIMENT

Figure 1:
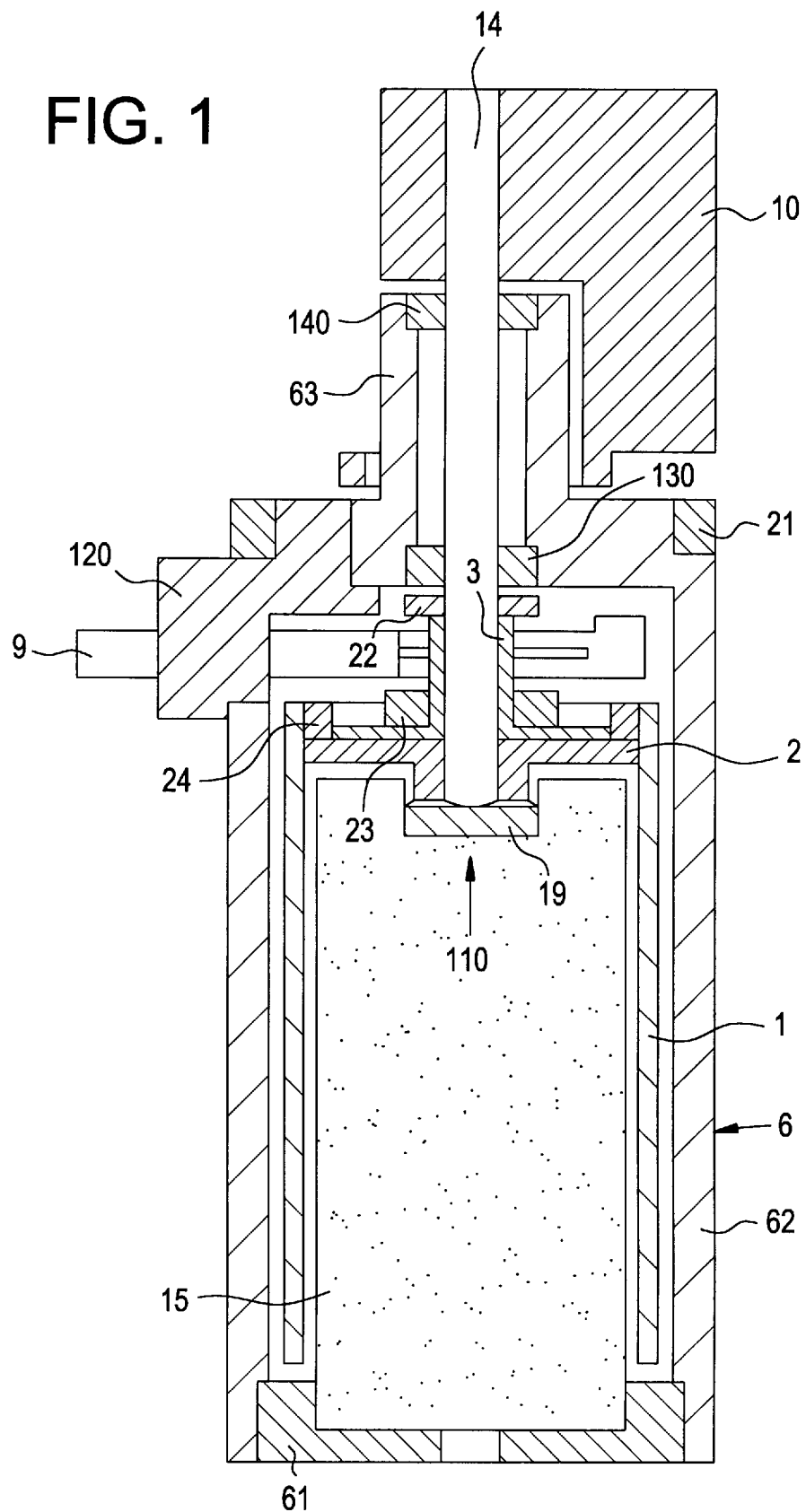
FIG. 1 is a cross-sectional view showing one embodiment of the present invention.
Figure 2:
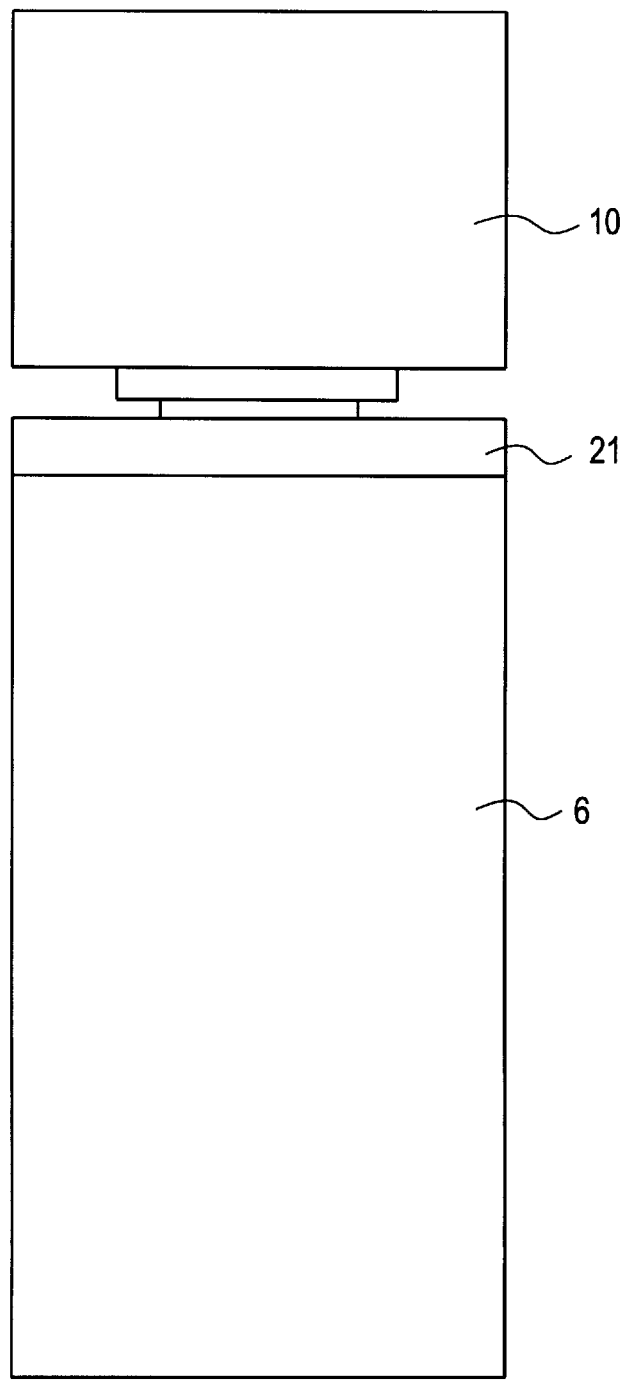
FIG. 2 is an external view of the present invention as shown in FIG. 1.

The coreless motor device in accordance with a first embodiment of the present invention is described below in further detail in connection with FIGS. 1 and 2. FIG. 1 is a cross-sectional view showing one embodiment of the present invention; FIG. 2 is an external view of the present invention as shown in FIG. 1.

As shown in FIG. 1, the motor device of this invention has a rotor comprised of a cylindrical coil 1, a cylindrical coil support 2, a rotary shaft 14 inserted and stabilized in the center of the cylindrical coil support 2, a commutator 3 installed either on the cylindrical coil support 2 or the rotary shaft 14, and a brush 9 in contact with the commutator 3. A cylindrical field magnet 15 is positioned inside the cylindrical coil 1, and one end of the cylindrical field magnet 15 is affixed at the bottom 61 of the cylindrical housing 6 which surrounds with its sides 62 the outer circumference of the cylindrical coil 1, with a clearance therebetween.

Figure 16:
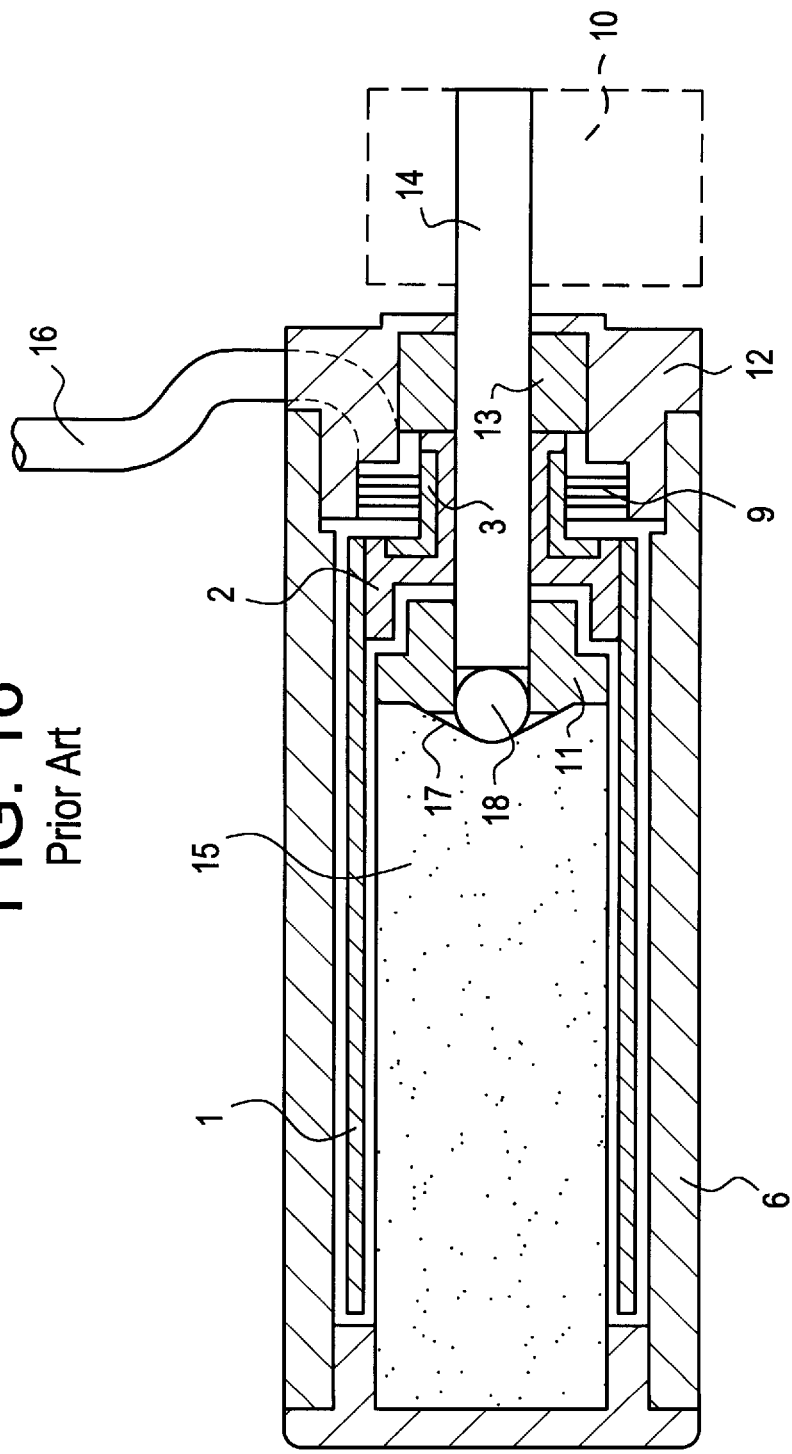
FIG. 16 is a cross-sectional view of a first improved conventional motor as shown in FIG. 15.

The rotary shaft 14 of the rotor is supported by a thrust bearing 110 at the end of the cylindrical field magnet 15 opposite to the end that is affixed at the bottom 61 of the cylindrical housing 6, and it is also supported by a multiple number of radial bearings 130 and 140 installed at intervals in the upper part 63 of the cylindrical housing 6. The brush housing 120 including the brush 9 is affixed to the notched part of the cylindrical housing 6 by a ring frame 21. Additionally, the commutator 3 is installed on the rotary shaft 14 by means of a liner 22 and a ring 23, and is made integral to the cylindrical coil support 2 with molded resin 24. Also, in this embodiment, a hard plate 19 is placed at the thrust bearing 110, and a thrust load is supported at one end of the rotary shaft 14 having a rounded end, and the upper part of the rotary shaft 14 is also supported by two radial bearings 130 and 140. An eccentric weight 10 is attached to the rotary shaft 14. Of course, for the thrust bearing 110, a ball 18 such as shown in FIG. 16, may be used instead of the hard plate 19.

The radial bearings 130 and 140 in the above configuration enable stable rotation of the rotary shaft 14 by positioning a multiple number of bearing points at intervals. As a consequence, deformation of the rotary shaft 14 is suppressed and durability and shock resistance are greatly improved. For the radial bearings 130 and 140, zirconium, sapphire, etc. are used in the most preferred embodiment of the present invention. By using jewel bearings such as sapphire, in particular, a device with superior durability and long life can be realized.

Figure 4:
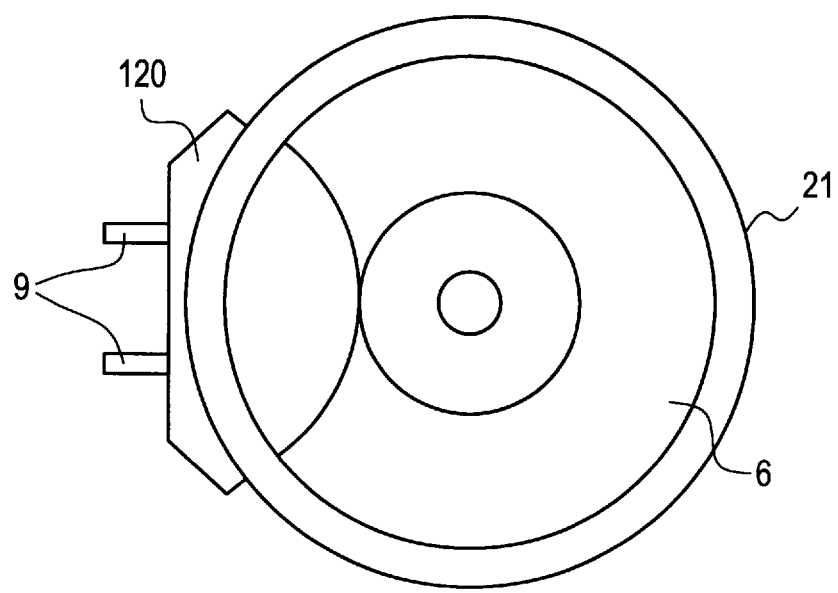
FIG. 4 is a top view of the present invention illustrating the attachment of the brush housing.
Figure 5:
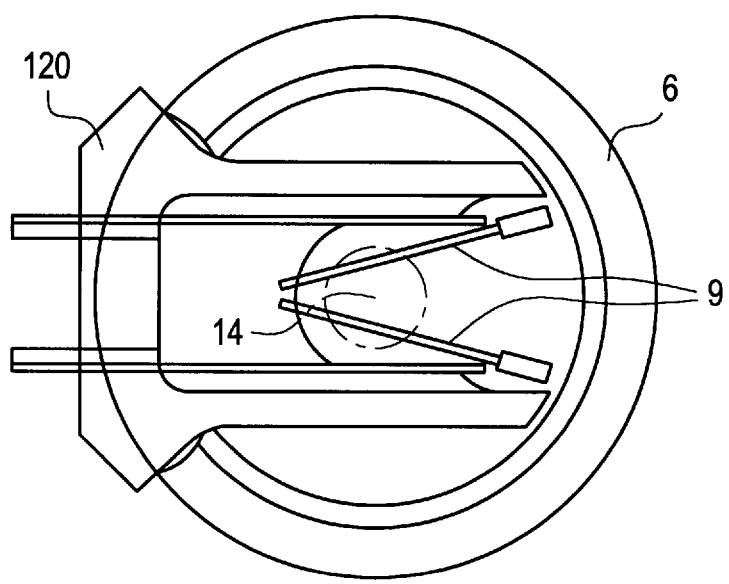
FIG. 5 is a cross-sectional view of the brush housing shown in FIG. 4.

Moreover, in the present embodiment, by using a brush housing 120 as stated above, and bonding it to the cylinder surface of the cylindrical housing 6, the brush 9 can be mounted very easily. In this case, as in the above example, a simple stabilizer using a ring frame 21 can be adopted. Referring to FIG. 4, a top view of the present invention illustrating the attachment of the brush housing is shown. Also, referring to FIG. 5, a cross-sectional view of the brush housing shown in FIG. 4 is illustrated. The brush housing 120 is inserted into the notched part of the cylindrical housing 6 and stabilized with a ring frame 21. As a result, the brush 9 comes in contact with the commutator 3.

With reference to the attachment of this brush housing 120, instead of the ring frame 21, a sealing cover 25 (FIG. 6) that covers the tip of the rotary shaft 14 as well as the weight 10 attached to the tip may be used for affixation and/or sealing. Of course, cover 25 may be used together with the ring frame 21, and not only used for stabilizing the brush housing 120, but rather primarily used as a covering.

Figure 17:
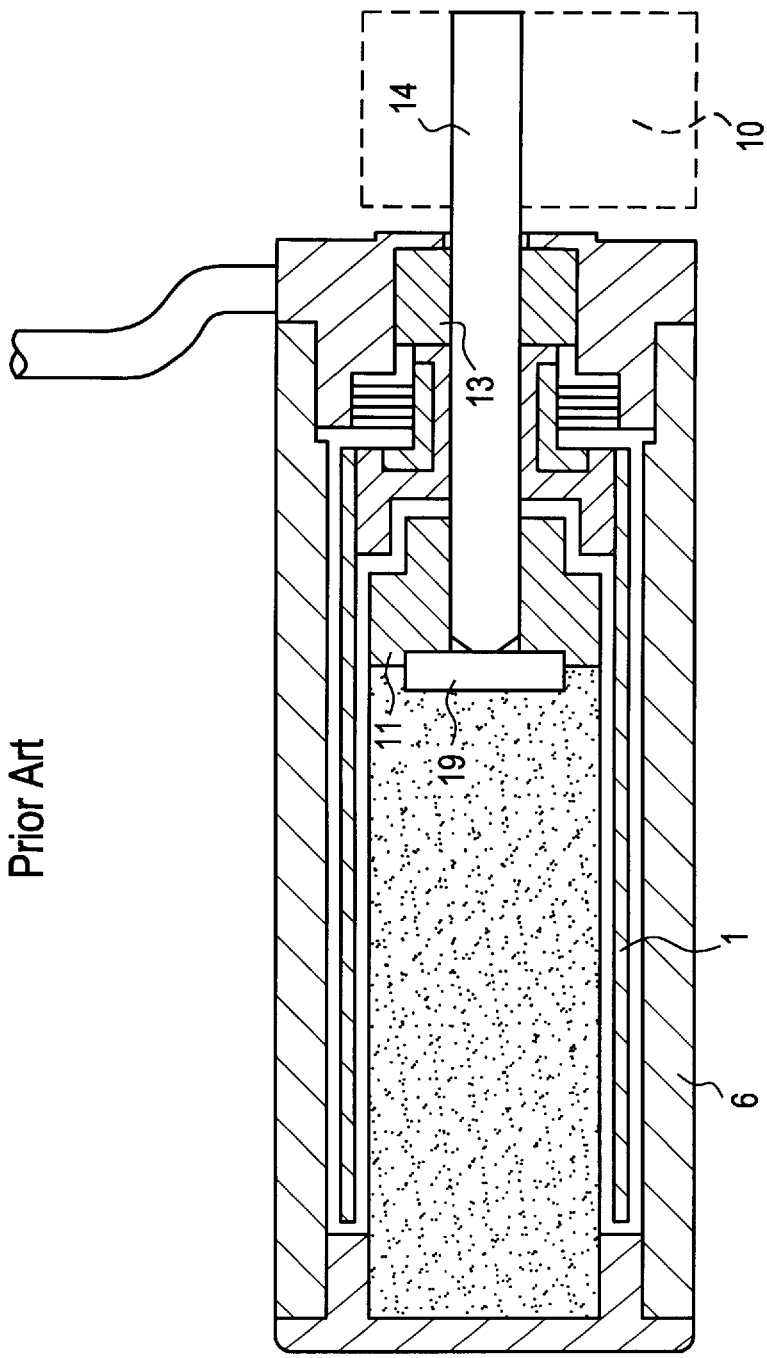
FIG. 17 is a cross-sectional view of a second improved conventional motor as shown in FIG. 15.
Figure 18:
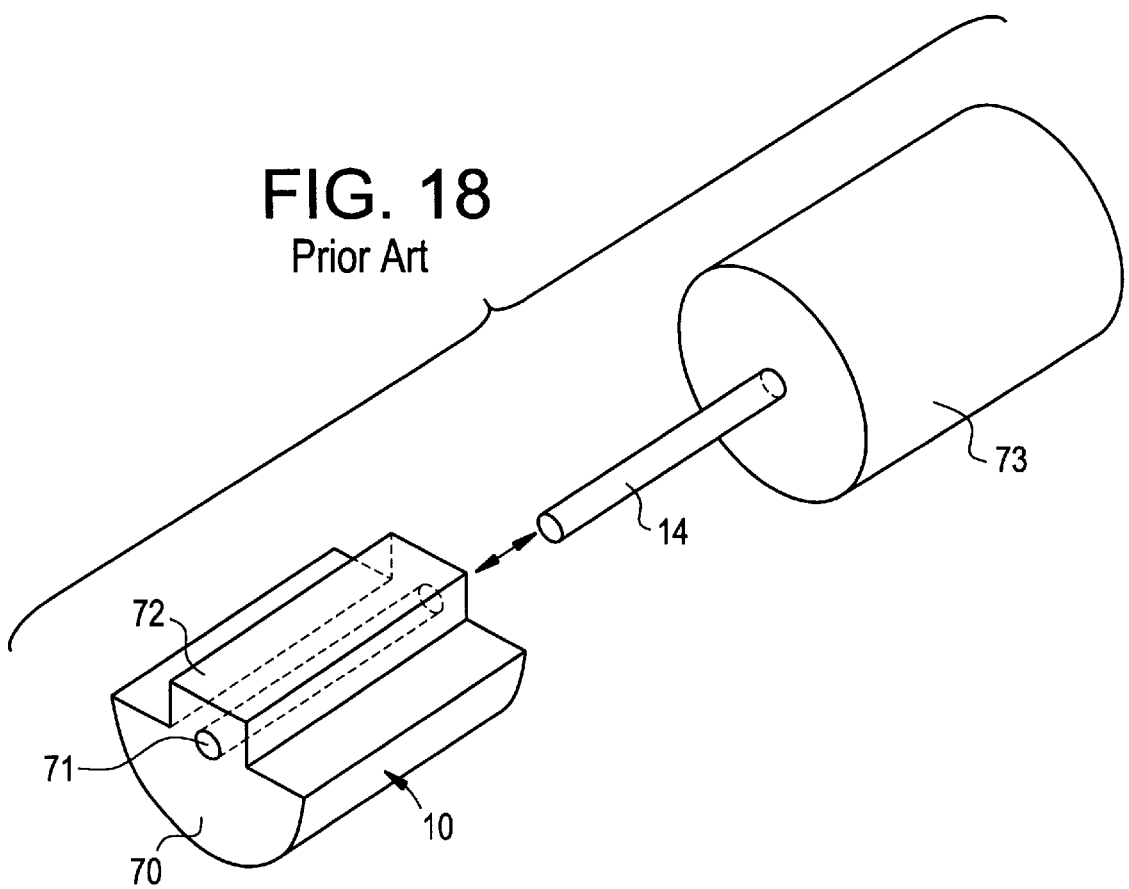
FIG. 18 is an external exploded diagonal view of a conventional weight assembly used in connection with the motor shown in FIG. 15.

As for the cylindrical field magnet 15, no hollow drilling was performed as in the examples discussed in connection with FIGS. 16 and 17. The bottom of the field magnet 15 is affixed to the bottom 61 of the cylindrical housing 6, and the top of field magnet 15 supports a rotary shaft 14 at the thrust bearing 110. Consequently, since there is no need for drilling of the field magnet 15, easy manufacturing and miniaturization of the motor device results.

Figure 6:
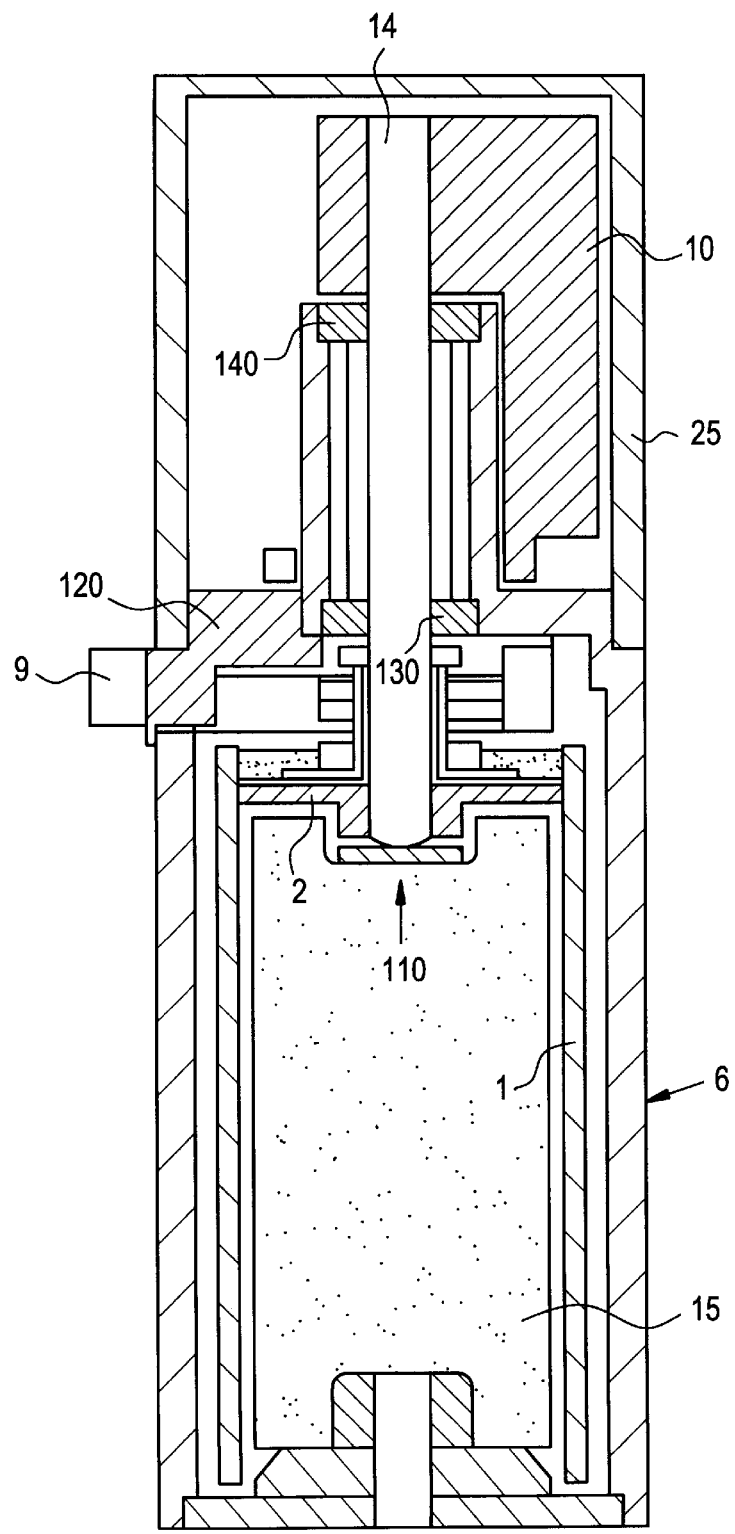
FIG. 6 is a cross-sectional view illustrating a second embodiment of the present invention.

Regarding affixation of the magnet 15 to the cylindrical housing 6, various configurations are applicable for bonding and affixation. Referring again to FIG. 6, which illustrates a second preferred embodiment of the present invention, a convex part and a concave part may be fabricated at the junction of the cylindrical housing 6 and the field magnet 15 respectively and they may then be fitted together and bonded. This results in greater bonding area and increased adhesive strength. In this case, in accordance with the second embodiment of the present invention as shown in FIG. 6, a relief hole can be made at the convex part of the bottom 61 of the housing 6 thus enabling air and the adhesive agent to escape. Furthermore, the relief hole also enables formation of an adhesive resin puddle and facilitates lightening of the magnet if necessary.

Referring next to FIG. 3a, an external exploded diagonal view of the present invention as shown in FIG. 1 further illustrating novel weight 10 in accordance with the present invention is shown. As can be seen in FIG. 3a, weight 10 includes a semi-circle part 70 having a groove 75, a raised portion 72 with a hole 71, a small diameter bearing housing 44 which inserts into groove 75, and houses a bearing. Weight 10 further includes ring 76 having a prescribed clearance with the outer circumference of the small diameter bearing housing 44 for radially supporting small diameter bearing housing 44 in the event of a shock to the device.

Figure 15:
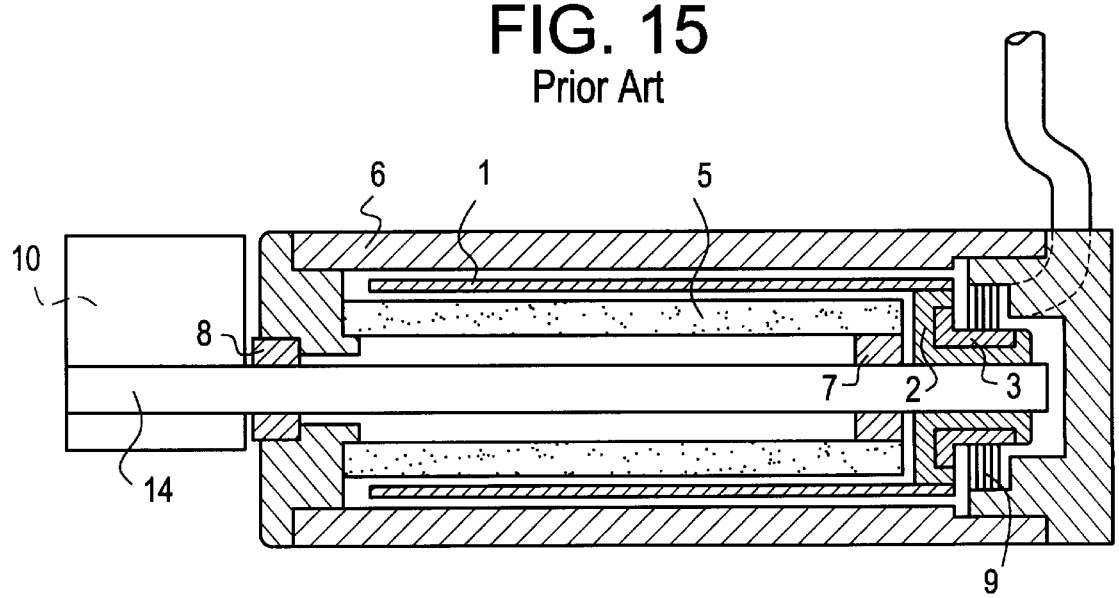
FIG. 15 is a cross-sectional view illustrating a conventional motor.

As shown in FIG. 3a, when the rotary shaft 14 is inserted into hole 71 and rotated, the center of gravity of weight 10 departs from the rotary shaft because groove 75 is formed in weight 10. Therefore, in comparison with conventional weights as discussed above, weight 10 in accordance with the present invention is light and still generates a larger rotational force, and thus vibration. In addition, the introduction of groove 75 enables positioning of the small diameter bearing housing 44 inside weight 10. That is, it enables positioning of small diameter bearing housing 44 in the vicinity of the center of gravity of weight 10. Therefore, when compared with the case where the center of gravity of weight 10 is displaced upwardly in the thrust direction from a bearing 8 shown in FIG. 15, the bending stress applied to the shaft by the rotational force is reduced. Furthermore, the bending stress applied to the shaft as a result of a shock to the device is also reduced, and the shaft becomes less liable to bend.

Referring next to FIG. 3b, a second preferred embodiment of a weight for use with a vibrating motor accordingly to the present invention is shown. In this embodiment, weight 10 includes semi-circular part 70 having groove 75, a raised portion 72 with a hole 71 formed therein, a small diameter bearing housing 44 which inserts into groove 75. In operation, hole 71 of weight 10 is fitted on to the rotary shaft 14 extending from small diameter bearing housing 44, and secured with caulking, or other suitable securing means. When shaft 14 is rotated, since the center of gravity of weight 10 is eccentric to the hole 71, vibration is generated.

Figure 3C:
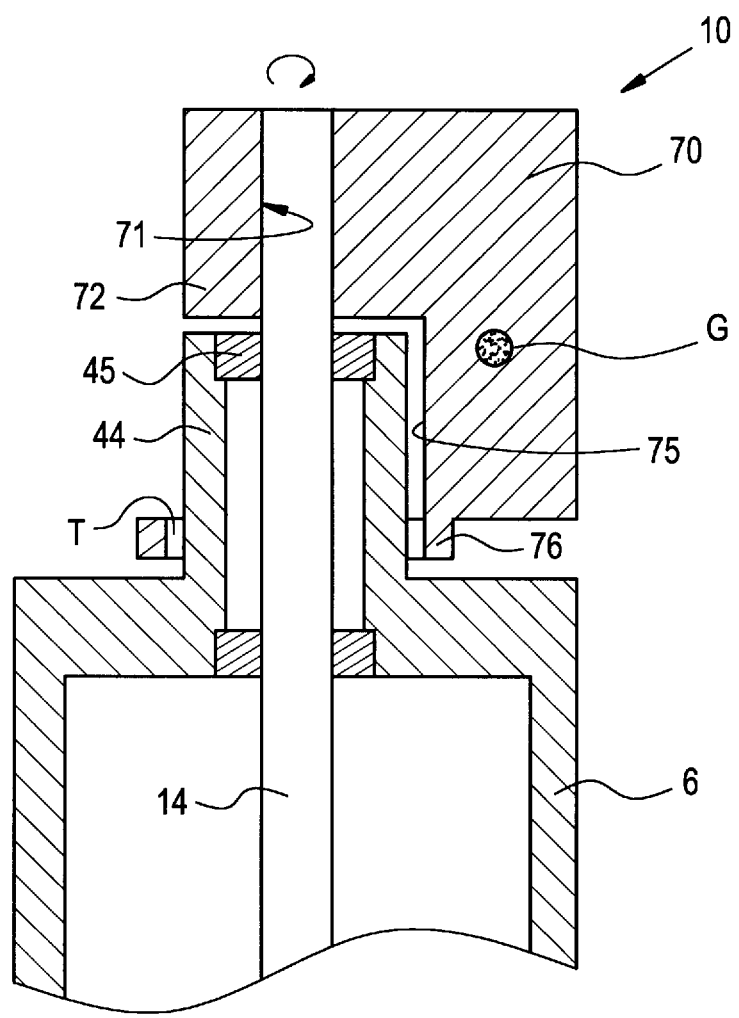

Referring next to FIG. 3c, a cross-sectional view of the weight for use with a vibrating motor accordingly to the present invention as shown in FIG. 3a is illustrated. As seen in FIG. 3c, weight 10 includes semi-circle part 70 having a groove 4, a raised portion 72 with a hole 71, and a ring 76 formed integral with a prescribed clearance T with respect to the outer circumference dimension of the small diameter bearing housing 44. In order to use this, as described previously, the hole 71 of the above-mentioned weight 10 is fitted on to the rotary shaft 14 of a small cylindrical coreless motor 6 equipped with a small diameter bearing housing 44, and secured with caulk, etc. When rotary shaft 14 is rotated, as the center of gravity of the weight 10 is eccentric to the hole 71, vibration is generated by the rotational force.

FIG. 3c shows weight 10 installed on a small cylindrical coreless motor 6, which is in demand when the outer diameter (φ) is below 5 mm, with the shaft diameter (φ) as small as 0.6 mm. Consequently, because the shaft is readily deformed by external shock or other factors, it is protected from external shock, etc. by means of ring 76 on the weight 10 placed with a slight clearance T from the small diameter bearing housing 44 of the motor 6. In addition, when the shaft 14 is inserted into the hole 71 and rotated, the center of gravity G of weight 10 departs from the rotary shaft 14 toward the outside in the radial direction because of groove 75 introduced in weight 10. Therefore, compared with a conventional type weight, this design provides a weight of the same size and weight that generates a greater rotational force, and thus vibration.

In addition, the introduction of the groove 75 enables positioning of the bearing 45 inside the weight 10, that is, it enables positioning of the bearing 45 in the vicinity of the center of gravity G of the weight. By doing so, compared with the conventional case of, for example, the center of gravity G of the weight 10 being displaced upwardly in the thrust direction from the bearing, the bending stress applied to the shaft by the rotational force is reduced. Furthermore, the bending stress applied to the shaft at the time of a shock is also reduced, and the shaft is less liable to bend.

As described above in detail, the weight of vibrating motors of this design is capable of generating a greater rotational force, and thus vibration, than conventional type weights of the same size and weight and can be used with small and light vibrating motors. Furthermore, since the center of gravity of the weight is in the vicinity of the bearing, the bending stress applied to the shaft by the rotational force is reduced. Furthermore, the bending stress applied to the shaft at the time of shock is also reduced, and the shaft is less liable to bend, thus enabling it to supply vibrating motors with excellent durability.

Figure 7:
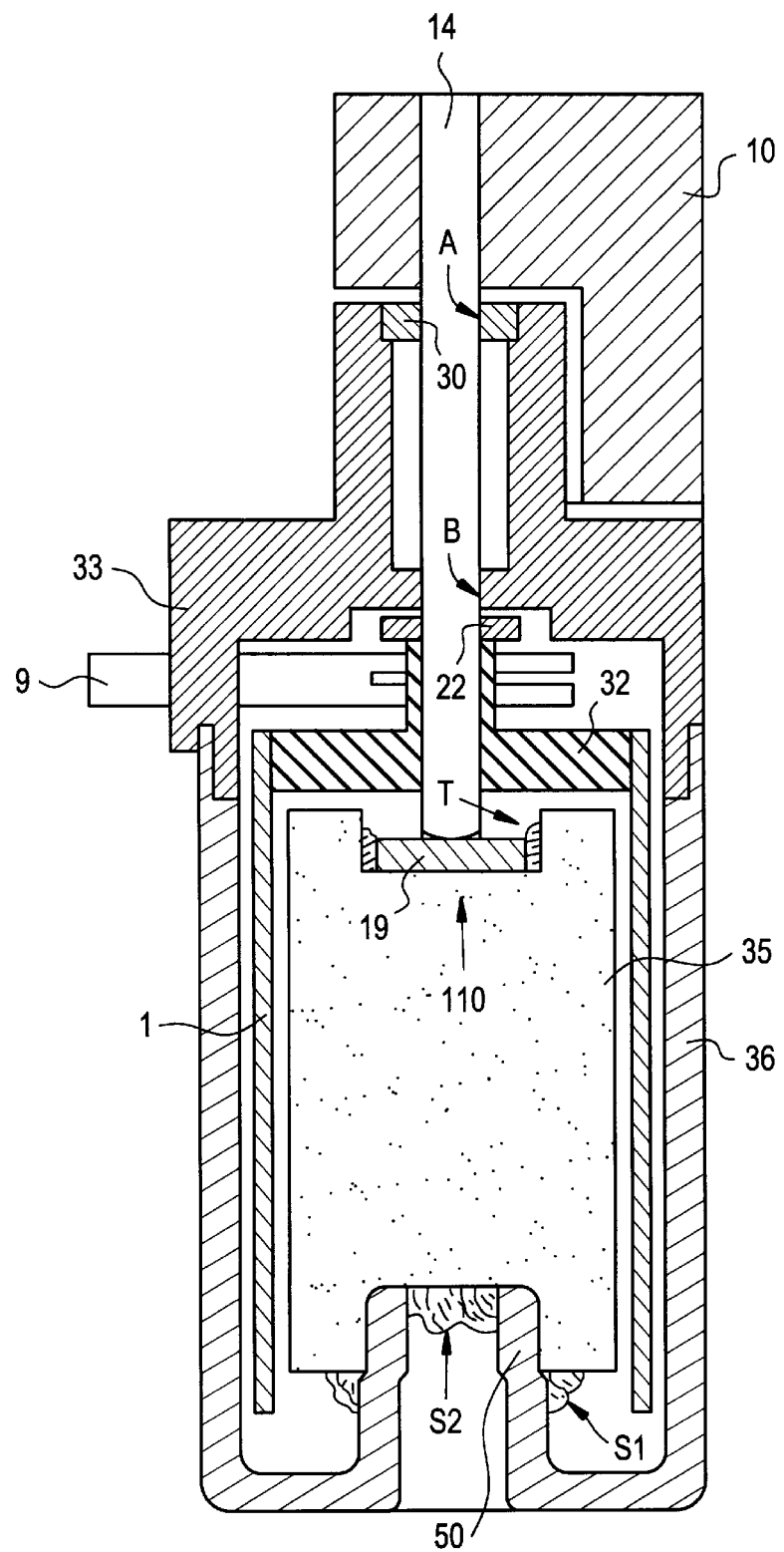
FIG. 7 is a cross-sectional view illustrating a third embodiment of the present invention.
Figure 8:
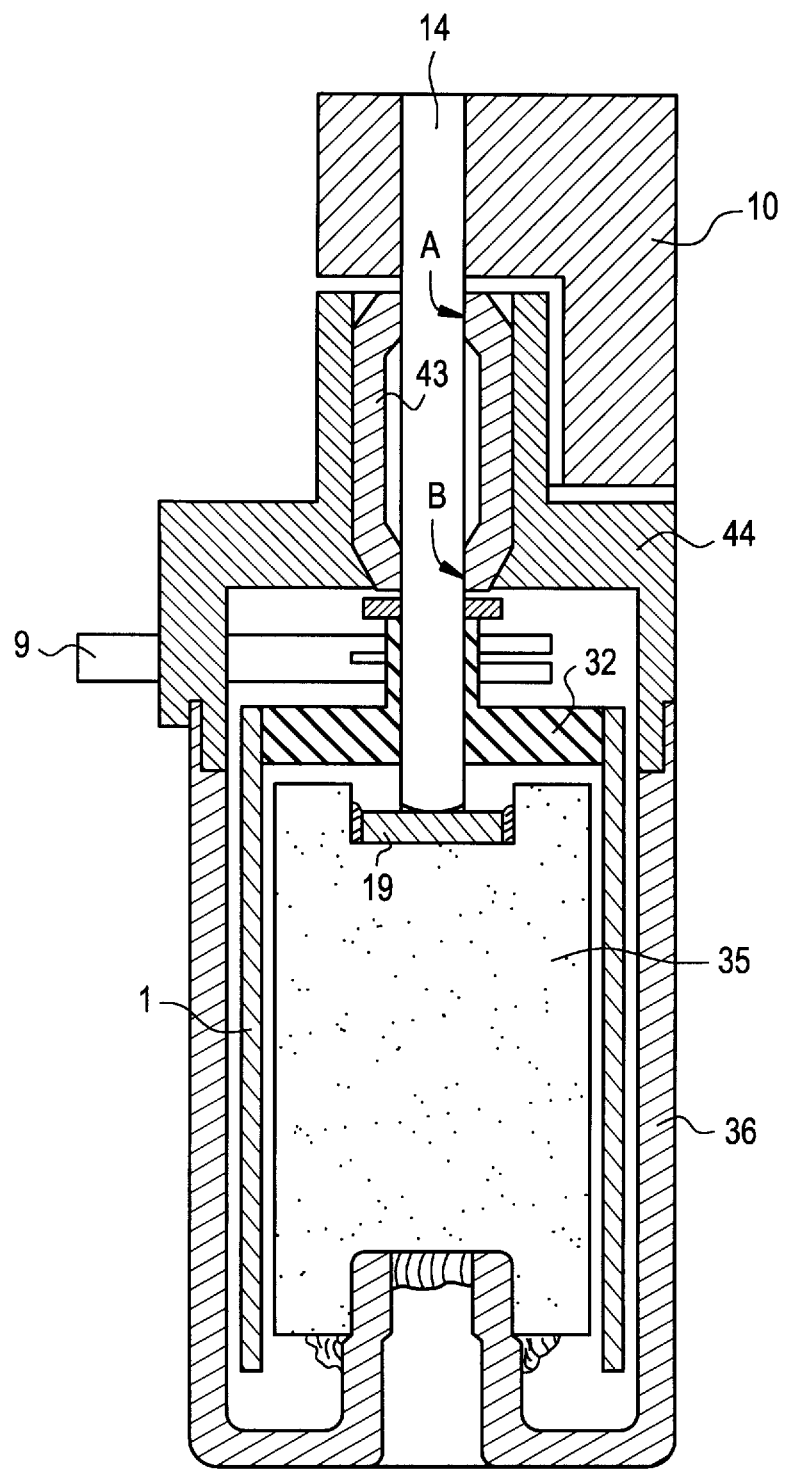
FIG. 8 is a cross-sectional view illustrating a fourth embodiment of the present invention.
Figure 9:
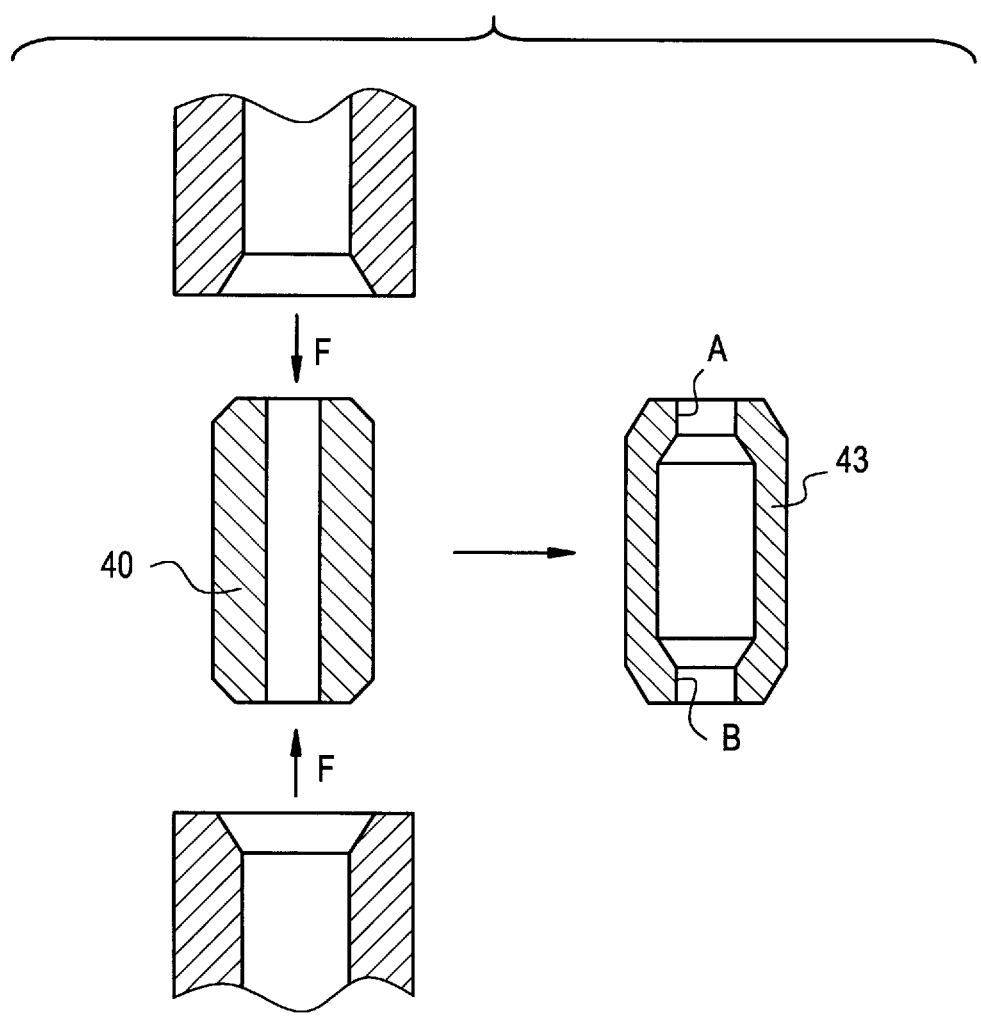
FIG. 9 is a cross-sectional view illustrating a hollow cylindrical member used in the embodiment of the present invention shown in FIG. 8.

Referring next to FIGS. 7–9, third and fourth embodiments of the present invention are illustrated and discussed in more detail. Specifically, FIG. 7 is a cross-sectional view illustrating a third embodiment of the present invention; FIG. 8 is a cross-sectional view illustrating a fourth embodiment of the present invention; and FIG. 9 is a cross-sectional view illustrating a hollow cylindrical member used in the embodiments of the present invention shown in FIG. 8.

Referring first to FIG. 7, a cylindrical coreless vibrating motor in accordance with a third preferred embodiment of the present invention has a rotor comprised of a cylindrical coil 1, a commutator 32 serving also as a coil support installed either on the cylindrical coil 1 or a rotary shaft 14, a brush 9 in contact with the commutator 32, with the rotary shaft 14 inserted and stabilized in the center of the commutator 32. On the inside of the cylindrical coil 1, one end of a cylindrical field magnet 35 is affixed to the bottom 50 of a cylindrical housing 36 which surrounds the outer circumference of the cylindrical coil with a clearance therebetween and a small diameter bearing housing 33 is stabilized at the upper part of the cylindrical housing 36.

In this device, the rotary shaft 14 of the rotor is supported by the thrust bearing 110 at the end of the cylindrical field magnet 35 opposite the one end that is affixed at the bottom 50 of the cylindrical housing 36, and it is also supported by a multiple number of radial bearing parts A and B installed at intervals within the small diameter bearing housing 33, which could be resin-molded. In this case, the bearing part B is formed integrally within the resin-molded small diameter bearing housing 33, and the bearing part A is structured by inserting the bearing 30, which could, for example, include a ball bearing, sliding bearing, jewel bearing, etc.

The resin-molded small diameter bearing housing 33 includes a brush 9 and is affixed to the upper part of the cylindrical housing 36, and the commutator 32 that serves also as the cylindrical coil support is installed on the rotary shaft 14 by a liner 22. As a result, the brush 9 comes into contact with the commutator 32.

The cylindrical field magnet 35, as in the previously improved example discussed above in connection with FIG. 6, has a concave bottom that is fitted and bonded to the convex bottom 50 of the cylindrical housing 36 with a relief hole. Consequently, no hollow drilling of field magnet 35 is required. Similarly, cylindrical field magnet 35 includes a concave top portion that receives a thrust bearing 110 and a hard plate 19 is attached and supports one end of the rotary shaft 14 with a rounded end. As a result, since the joined parts have convex and concave surfaces, the bonded area is greater and as a result the bond strength increases. Furthermore, since air and the adhesive agent are able to escape, the formation of an adhesive resin puddles S1, S2, and T is possible, thus increasing bond strength. In addition, because of the convex formation of the bottom 50 of the iron cylindrical housing 36, a magnetic circuit is completed with the field magnet 35 and cylindrical coil 1 at the bottom 50, thus enabling effective use of the magnetic force. Also, since no precision drilling work of magnet 35 is needed, manufacturing is simplified and miniaturization and higher efficiency of the motor device are possible.

In the above described third embodiment, although the bearing part A is structured by inserting the bearing 30 including, for example, a ball bearing, sliding bearing, jewel bearing, etc., the bearing A may be formed integrally within the resin-molded small diameter bearing housing 33 as is bearing B. Consequently, the number of expensive bearings can be reduced thus achieving a further cost reduction.

A cylindrical coreless vibrating motor in accordance with a fourth embodiment of the present invention is shown in FIGS. 8 and 9. Referring to FIG. 9, in order to manufacture the radial bearing parts at a lower cost, the radial bearing parts are configured to form bearing parts A and B within the hollow cylindrical member 40 by applying pressure on the top and bottom of the outer circumference of a hollow cylindrical member 40 made of sintered metal. Referring next to FIG. 8, the resulting cylindrical bearing 43 having two radial bearing parts A and B is fitted into the small diameter bearing housing 44.

As described above in detail, the present invention allows smaller and lighter coreless motor devices having a rotary shaft with a smaller diameter than in conventional motor devices and that has both stable durability and excellent shock resistance. Also as described above in detail, the present invention includes a resin-molded, small diameter bearing housing that results in an iron cylindrical housing having a simpler shape and thus results in lower cost. Furthermore, the integral formation of the radial bearing parts within the resin-molded small diameter bearing housing eliminates the need for expensive bearings, thus lowering the cost. Furthermore, forming cylindrical bearings having radial bearings elements to fit into the small diameter bearing housing results in easier manufacturing and assembly. Consequently, the present invention results in a lower cost motor device and presents a smaller, highly efficient, novel cylindrical coreless vibrating motor which is easily mass producible.

Figure 13:
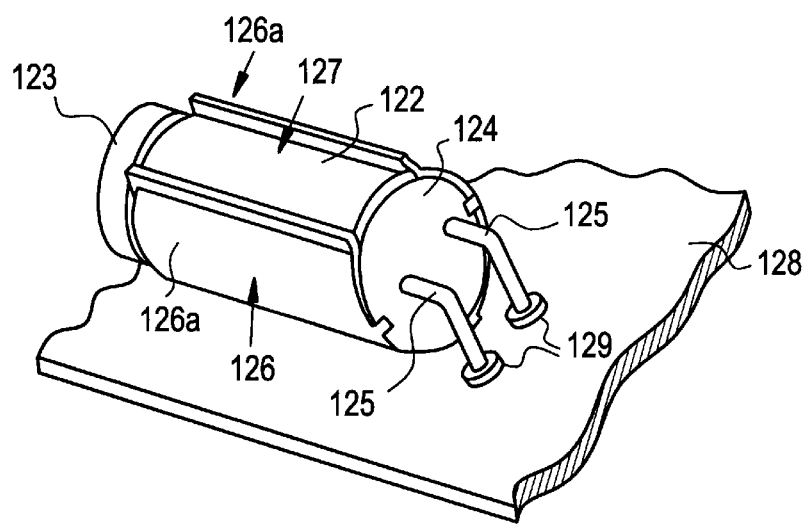
FIG. 13 is a diagonal view of a conventional motor retaining device.
Figure 14:
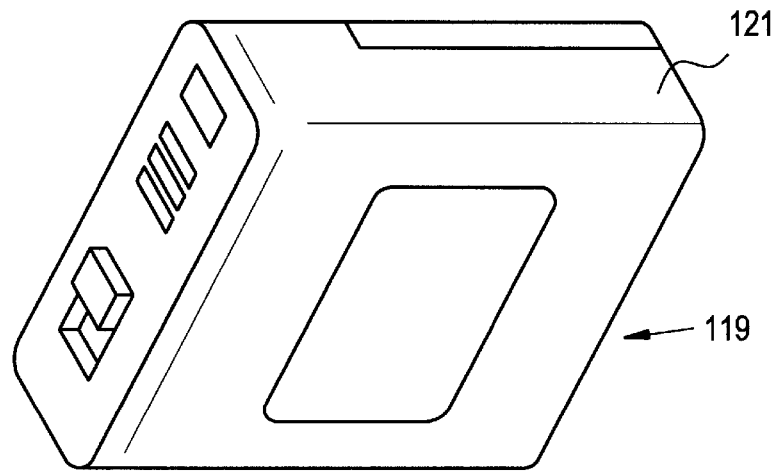
FIG. 14 is a diagonal view showing a personal call receiver using the above device.

FIG. 13 is a diagonal view of another embodiment of the present invention showing the installed state of a vibrating motor, which could be in accordance with the embodiments discussed above, on a board for generating vibrations in a conventional personal call receiver. FIG. 14 is a diagonal view showing an example of such a personal call receiver in which the above device is used. In FIGS. 13 and 14, 119 is a personal call receiver and 121 is a case for the receiver 119. Reference number 122 designates a vibrating motor, and an unbalanced weight 123 such as described above is made integral to the rotary shaft by caulking, etc. On the other end of motor 122 is a printed circuit board 124, in which a pair of rod-shaped electrodes 125 are installed in one area. Vibration of the motor 122 is obtained when the output shaft and the unbalanced weight 123 rotate in unison.

Here, each rod-shaped electrode 125 is bent in the form of a letter "L" and projects from the end surface of the motor 122. Retaining fixture 126 is made of a spring metal plate and retaining fixture 126 includes a pair of spring retainer clips 126*a* formed by bending retaining fixture 126 into a U-shape with an opening 127 at the top.

Printed circuit board 128 includes a pair of holes used for mounting sockets that are made in positions corresponding to the rod-shaped electrodes 125 of the motor 122. Cylindrical sockets 129 are inserted into the above holes for plugging in the rod-shaped electrodes 125, and the sockets are held in place by soldering, etc. and electrically connected in advance.

However, in the case of the conventional small motor terminal as shown in FIG. 14, precision is essential in the formation of rod-shaped electrodes 125 and sockets 129 for installing the motor, and one problem was that the rod-shaped electrodes when bent were difficult to insert. In addition, when using it as a vibrating motor, the contact points can wear out or loosen, thus causing poor electrical contact. In the case where the terminals are soldered, there is a further problem of damaging the junction of the terminal through vibration of the motor 122.

Figure 10:
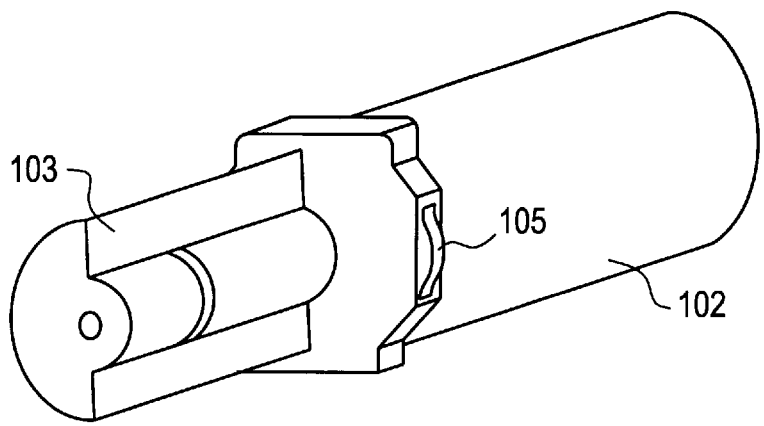
FIG. 10 is a diagonal view showing an example of the small motor terminal of this invention.
Figure 11:
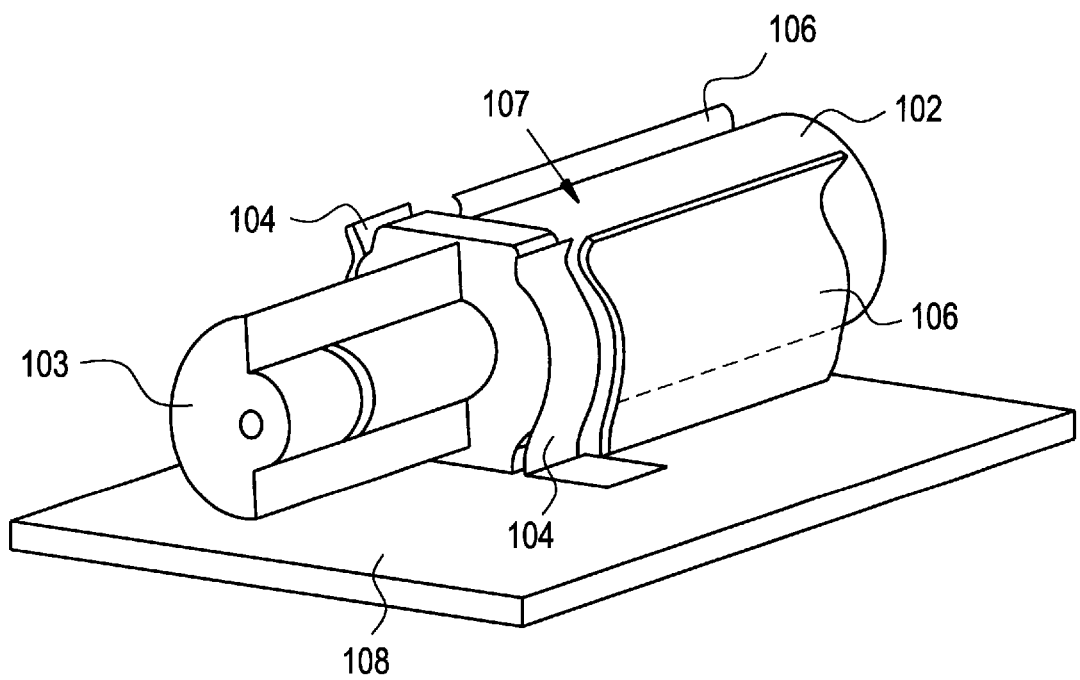
FIG. 11 is a diagonal view showing installed state of the small motor terminal on the board in an example of this invention.
Figure 12:
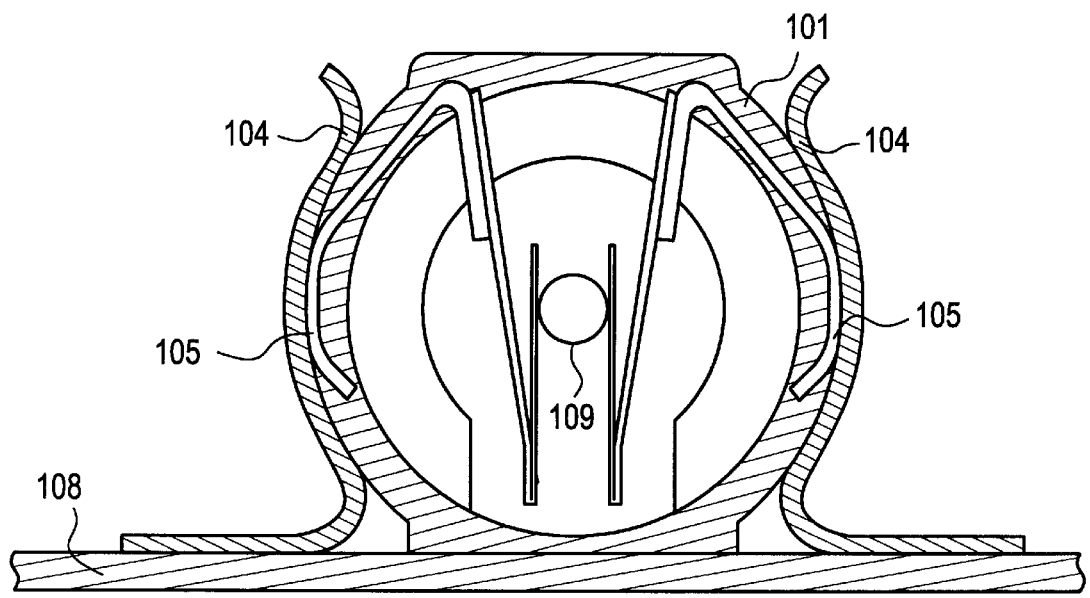
FIG. 12 is a cross-sectional view showing a cross-section of the terminal unit for small motors in the example of this invention.

Referring to FIGS. 10–12, the present embodiment solves the above-mentioned problems, and is comprised of a motor 102 installed with its axial direction paralleling a mounting board, e.g., a printed board, an eccentric weight 103 installed at one end of the output shaft of the motor 102, a pair of spring electrodes 105 installed on the outer circumference of the motor 102, a pair of spring clip couplings 104 positioned facing each other with a space for pressure-loading the spring electrodes 105, and a pair of spring retainer clips 106 positioned facing each other with a space for pressure-loading the motor 102.

Application of this invention has the following action as the motor 102 is pressure-loaded in the retaining fixture, the spring clip couplings 104 and the spring retainer clips 106; the spring electrodes 105 are pressure-loaded into the spring clip couplings 104 concurrently with the pressure-loading of the motor; whereby the motor is easily retained and, at the same time, the electrical connections between the spring clip couplings 104 and the spring electrodes 105 are readily established, which assures electrical connections that are durable and accurate even in an environment with a vibration source.

An example of this embodiment of the present invention is explained below with further reference to FIG. 10, which is a diagonal view showing an example of the small motor terminal of this invention, FIG. 11, which is a diagonal view showing an example of a small motor terminal installed on the board, and FIG. 12, which is a cross-sectional view showing a cross-section of an example of the terminal unit for the small motor of this invention.

The configuration of the small motor terminal according to this invention is comprised of a motor 102 installed on a printed board 108 with its axial direction paralleling the board, an eccentric weight 103 installed at one end of the motor 102, a pair of spring electrodes 105 installed on the outer circumference of the motor 102, a pair of spring clip couplings 104 positioned facing each other with a space for pressure-loading the spring electrodes 105, and a pair of spring retainer clips 106 positioned facing each other with a space for pressure-loading the motor 102 therebetween.

As shown in FIG. 12, the pair of spring electrodes 105 are insert-adhered to, or formed integrally with, the housing 101 of the motor 102 from the outer circumference. By simple insertion, the electrodes slide and contact the commutator 109, and the contact point is exposed on the outer circumference of the motor 102.

In the above-mentioned example, installation on the printed board 108 of the motor 102 is performed by using retaining fixtures, i.e., spring retainer clips 106 and spring clip couplings 104, which are affixed on the printed board 108 in advance. In other words, when the motor 102 is pressure-loaded from the opening 107, the motor 102 is clamped by pressure from both sides by the pair of spring retainer clips 106. At the same time, the spring electrodes 105 are also clamped by pressure from both sides by the spring clip couplings 104, and electrical connections are established between spring electrodes 105 and spring clip couplings 104.

As explained, according to the above-mentioned example, as the motor 102 is pressure-loaded into the retaining fixtures, spring clip couplings 104 and spring retainer clips 106, the spring electrodes 105 are pressure-loaded into the spring clip couplings 104, whereby the motor is easily secured and at the same time, the electrical connections of the spring clip couplings 104 and the spring electrodes 105 are readily established. Thus, durable and accurate electrical connections are achieved even in an environment being subject to vibrational forces, such as a messaging unit, or pager.

As described above in detail, this aspect of the present invention reduces the number of operations required during motor installation and securing of the motor is performed concurrently. Thus, the present invention provides a small motor terminal in which an accurate contact point is ensured without causing defects due to vibrations even when a vibration source exists.

I claim:

1. A coreless motor device having a rotor comprised of a cylindrical coil, a cylindrical coil support, a rotary shaft inserted and stabilized in the center of said cylindrical coil support, a commutator installed on one of the cylindrical coil support and the rotary shaft, a brush in contact with said commutator, a cylindrical field magnet positioned inside said cylindrical coil and having a first end affixed at a bottom of a cylindrical housing which surrounds the outer circumference of said cylindrical coil with a clearance therebetween, a small diameter bearing housing formed at an upper part of said cylindrical housing, said small diameter bearing housing having a diameter less than that of said cylindrical housing, wherein said rotary shaft is supported by a multiple number of radial bearings installed at intervals in said small diameter bearing housing and said small diameter bearing housing is resin-molded and at least one of said radial bearings is integrally formed as a part of said resin-molded small diameter bearing housing.

2. The coreless motor device of claim 1 wherein a brush housing for containing said brush is fitted on the exterior of the cylindrical housing.

3. The coreless motor device of claim 2 wherein said brush housing is attached to a notched part of said cylindrical housing and fastened to the cylindrical housing with a ring frame.

4. The coreless motor device of claim 2 wherein said brush housing is attached to a notched part of said cylindrical housing and sealed to said cylindrical housing by an annular end of a cover which covers both the rotary shaft and an eccentric weight attached to a tip of said rotary shaft.

5. The coreless motor device of claim 1 wherein at least one of said radial bearings comprises a jewel bearing.

6. The coreless motor device of claim 1 wherein said first end of said cylindrical field magnet includes a concave portion and said cylindrical housing includes a convex portion and said concave and convex portions are bonded together.

7. The coreless motor device of claim 1 further comprising a relief hole for releasing air and adhesive agent on the side of said cylindrical housing at the junction between said cylindrical housing and said field magnet.

8. The coreless motor device of claim 1 in which said upper part of said cylindrical housing has a reduced diameter relative to said bottom part.

9. The coreless motor device of claim 1 further comprising a weight connected with said rotary shaft.

10. A cylindrical coreless vibrating motor having a rotor comprised of a cylindrical coil, a commutator that supports said cylindrical coil, a brush in contact with said commutator, a rotary shaft inserted and stabilized in the center of said commutator, said commutator being installed on one of said cylindrical coil and said rotary shaft, a cylindrical field magnet positioned inside said cylindrical coil and having a first end affixed at a bottom of a cylindrical housing which surrounds the outer circumference of said cylindrical coil with a clearance therebetween, a resin-molded small diameter bearing housing at an upper part of said cylindrical housing, said small diameter bearing housing having a diameter less than that of said cylindrical housing, wherein said rotary shaft is supported by a multiple number of radial bearing parts integrally formed as part of said resin-molded small diameter bearing housing.

11. The cylindrical coreless vibrating motor of claim 10 further comprising a cylindrical bearing fitted into said small diameter bearing housing, said cylindrical bearing comprising two radial bearings.

12. The coreless motor device of claim 9 wherein said weight is disposed outside of said small diameter bearing housing.

13. The coreless motor device of claim 12 wherein a center of gravity of said weight is substantially aligned in a radial direction with one of said multiple number of radial bearings.

14. The coreless motor device of claim 10 further comprising a weight connected with said rotary shaft.

15. The coreless motor device of claim 14 wherein said weight is disposed outside of said small diameter bearing housing.

16. The coreless motor device of claim 15 wherein a center of gravity of said weight is substantially aligned in a radial direction with one of said multiple number of radial bearings.

* * * * *